US009819848B2

(12) United States Patent
Mirhosseini-Schubert

(10) Patent No.: US 9,819,848 B2
(45) Date of Patent: Nov. 14, 2017

(54) CAMERA STROBE HAVING MULTI-LED PACKAGES

(71) Applicant: Apple Inc., Cupertino, CA (US)

(72) Inventor: Roya Mirhosseini-Schubert, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 61 days.

(21) Appl. No.: 15/048,937

(22) Filed: Feb. 19, 2016

(65) Prior Publication Data

US 2017/0094138 A1 Mar. 30, 2017

Related U.S. Application Data

(60) Provisional application No. 62/235,493, filed on Sep. 30, 2015.

(51) Int. Cl.
| | |
|---|---|
| H04N 5/222 | (2006.01) |
| H04N 5/225 | (2006.01) |
| H01L 25/13 | (2006.01) |
| H01L 33/60 | (2010.01) |
| H01L 33/54 | (2010.01) |
| H01L 33/50 | (2010.01) |
| H01L 25/075 | (2006.01) |
| H01L 33/62 | (2010.01) |
| H01L 33/58 | (2010.01) |

(52) U.S. Cl.
CPC ....... *H04N 5/2256* (2013.01); *H01L 25/0753* (2013.01); *H01L 25/13* (2013.01); *H01L 33/507* (2013.01); *H01L 33/54* (2013.01); *H01L 33/58* (2013.01); *H01L 33/60* (2013.01); *H01L 33/62* (2013.01)

(58) Field of Classification Search
CPC ... H04N 5/2256; H01L 25/0753; H01L 25/13; H01L 33/507; H01L 33/54; H01L 33/58; H01L 33/60; H01L 33/62
USPC .................................................. 348/370, 371
See application file for complete search history.

(56) References Cited

U.S. PATENT DOCUMENTS

| | | | |
|---|---|---|---|
| 7,318,651 B2 | 1/2008 | Chua et al. | |
| 7,983,552 B2 * | 7/2011 | Moon | F21L 4/02 257/100 |
| 8,845,115 B2 * | 9/2014 | Holman | G03B 15/05 362/11 |
| 8,895,998 B2 | 11/2014 | Hussell et al. | |

(Continued)

*Primary Examiner* — Tuan Ho
*Assistant Examiner* — Zhenzhen Wu
(74) *Attorney, Agent, or Firm* — Blakely Sokoloff Taylor & Zafman LLP

(57) ABSTRACT

First and second multi-LED packages are installed on a carrier. Each package includes its own emitting diodes that are series coupled to each other and that are encased within a single, internally reflective package having two external terminals. Each package has a light output face from which light, produced by all of the emitting diodes contained therein is emitted in response to a forward current passing through the two terminals. Each package also has phosphor mediums each positioned to be stimulated by primary light of a respective one of its contained emitting diodes, and in response emit secondary wavelength-converted light that emerges from the light output face and is combined with some of the primary light to yield white light. Other embodiments are also described and claimed.

20 Claims, 5 Drawing Sheets

(56) References Cited

U.S. PATENT DOCUMENTS

| | | | | |
|---|---|---|---|---|
| 2005/0174473 A1* | 8/2005 | Morgan | ............... | F21S 48/325 |
| | | | | 348/370 |
| 2006/0250519 A1* | 11/2006 | Kawakami | ............ | G03B 15/05 |
| | | | | 348/371 |
| 2010/0155745 A1* | 6/2010 | Huang | ............... | H01L 25/0753 |
| | | | | 257/88 |
| 2014/0291715 A1 | 10/2014 | Reiherzer et al. | | |

* cited by examiner

CAMERA STROBE HAVING MULTI-LED PACKAGES

This non-provisional application claims the benefit of the earlier filing date of provisional application No. 62/235,493 filed Sep. 30, 2015.

FIELD

An embodiment of the invention relates to camera strobes for use in portable consumer electronic devices, such as smartphones, that use lighting emitting diode (LED) die structures. Other embodiments are also described.

BACKGROUND

LED die structures have made in roads into a variety of illumination devices over the past decade, in particular as the main illumination device of a photography strobe (camera flash). The use of LED die structures allows fine-grained electronic control of the intensity of the illumination as well as its color. As an example, a camera flash may contain multiple LED chips, where one is designed to produce a cool white output, while the other is designed to produce a warm white output. The cool white chip includes an LED die structure covered with a yellow phosphor, while the warm white chip has another LED die structure that is covered with yellow and red phosphors. When stimulated by a primary light from the LED die, the phosphor emits secondary, wavelength-converted light at a longer wavelength, such that the combination of the secondary wavelength-converted light and the primary light emitted from the two LED dies structures (typically blue LEDs that are within +/−10 nm, for example) result in a combined, white illumination. In one case, the cool white portion of the flash may be designed to produce a correlated color temperature (CCT) of 5500K. The warm white chip produces a warmer light, at a target CCT of 2800K. Each of the LED die structures is driven with a regulated current independently of the other, so as to control the intensity of the combined white illumination as well as the shade of the white illumination. In other words, the combined white illumination may be varied between 2800K (warm) and 5500K (cool), by varying the ratio of the regulated currents that are applied to the two LED die structures. For example, to obtain 5000K (a cool white light), more current is injected into the cool white chip than into the warm light LED chip.

SUMMARY

The conventional technique described above for obtaining a range of combined white illumination, between cool and warm light, does not suggest how to achieve a higher light output intensity, other than using larger LED dies that each can produce greater light intensity (in response to greater input currents), or simply providing additional LED dies. A problem arises where there are constraints on the physical space or volume of the strobe, as found in portable electronic devices such as smartphones, while a higher light output is desired. A further problem is that the two different color phosphor mediums of a conventional LED-based camera strobe exhibit a two tone color combination that is clearly visible to a naked human eye. For cosmetic reasons, it may be desirable for the camera strobe, of a smartphone for example, to exhibit a single or uniform color in its off state, while still being able to adjust the intensity and color temperature of the combined illumination between warm and cool white light, and while also being able to provide higher light intensity.

An illumination device has a first multi-LED package that includes several first emitting diodes, which are series coupled to each other and encased within a single, internally reflective package having two external terminals. The package has a light output face from which light produced from all of the first emitting diodes is to emerge, in response to a first current passing through the two terminals. Several of such multi-LED packages may be used, for example as mounted on a circuit carrier, as part of a camera flash or strobe (an illumination device for camera and photography uses.) Each individual emitting diode should be sized to be small enough so that as a whole, when there are two or more packages combined underneath a lens of a strobe, the volume or space constraints are met.

In one embodiment, the emitting diodes in each multi-LED package are series coupled to each other to form a high voltage LED device, for example having a turn on voltage greater than 20 volts DC (as measured across the two terminals of the multi-LED package). In another embodiment, a current ratio control and current source circuit is provided that generates a separately controllable, constant current into each multi-LED package, such that a ratio of the package currents between any two packages, can be controlled or set as desired. Such an embodiment is especially useful when each multi-LED package also includes phosphor mediums, such as phosphor palettes, where each phosphor medium is positioned to be stimulated by the primary light from a respective one of the emitting diodes. In response to being stimulated by the primary light, secondary wave length converted light is emitted that also emerges from the light output face of the package. This combination of the primary light and the secondary light may yield white light whose color may depend on the colors of the phosphor mediums. In addition, the total light output, by the multiple packages, may have a white color light that is adjustable between warm white and cool white, as a function of the ratios of package currents, which may be adjustable to provide a range of white between warm and cool.

In a further embodiment, the phosphor mediums for each package include at least two phosphor mediums of different colors, and more preferably at least three phosphor mediums having three different colors, respectively. In one embodiment, each package has at least eight emitting diodes where each is covered with a respective phosphor medium, and there are at least three different colors of phosphor mediums (where these may be the same three different colors used for each package). The individual size and overall arrangement of the phosphor mediums of various colors, in each package and also as a whole for all packages that are underneath the lens of the camera strobe, should be selected such that the entire emitting surface of the camera strobe appears to be uniform in color as viewed from outside of the housing, when the illumination device is turned off. For example, if the entire illumination surface of the device appears uniform in color to a naked human eye from 20 centimeters away, this may help improve the cosmetic appearance of the portable camera device in which the illumination device is integrated (as a camera strobe.)

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness or reducing the total number of drawings, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not explicitly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
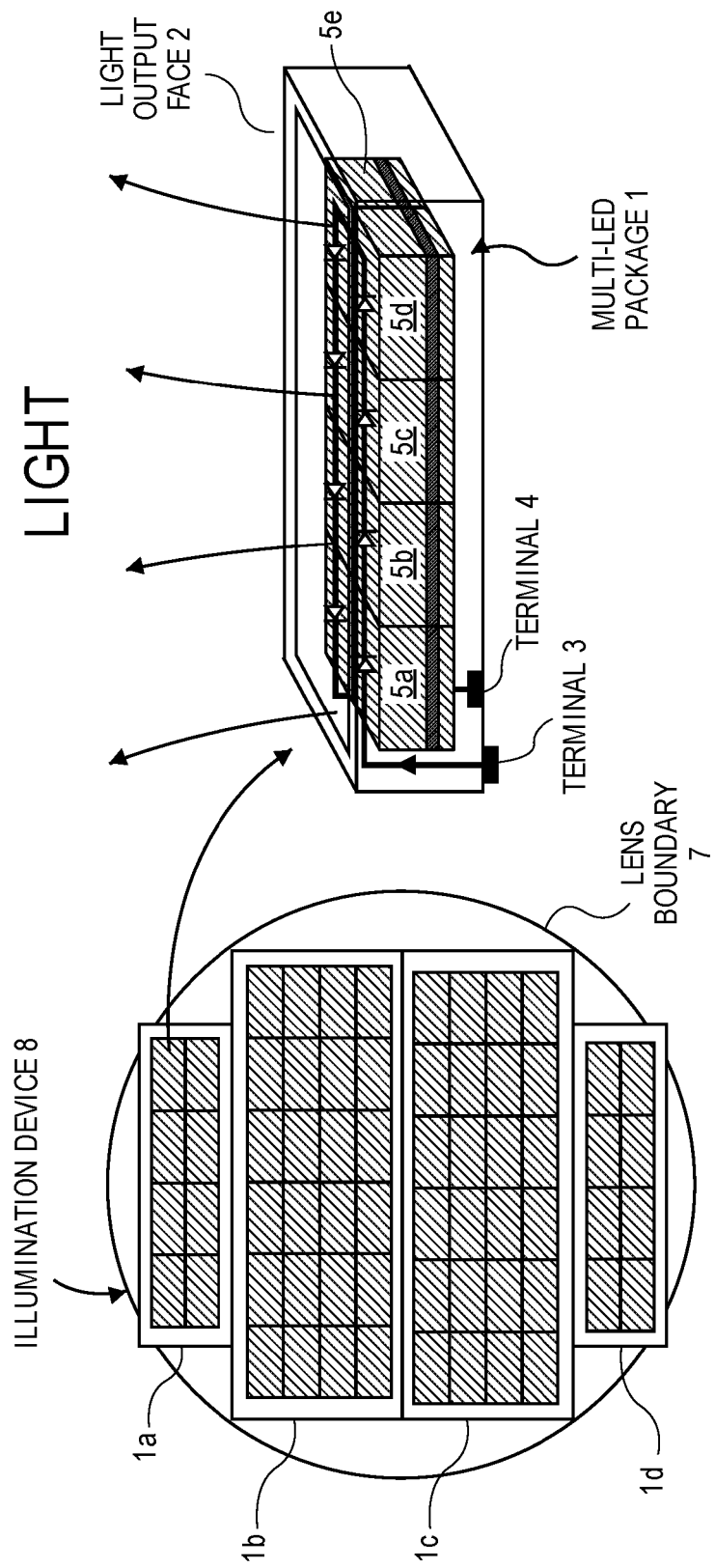
FIG. 1 shows a perspective view of a single multi-LED package overlaid with its circuit schematic, and a top view of an illumination device having several such packages mounted within a lens boundary, in accordance with different embodiments of the invention.

FIG. 1 shows a prospective view of a multi-LED package 1. The package 1 has an internally reflective cavity (internally reflective package walls defining the cavity) and may have two external electrical terminals 3, 4 as shown. The package 1 may be surface mounted on a carrier 6 (a printed circuit board, flex or other example, see FIG. 2) to receive a current through the terminals 3, 4 as may be provided by for example a current source (not shown). The package includes therein (within the reflective cavity) a number of emitting diodes 5, in this example eight (5a, 5b, 5c, 5d, 5e, 5f, 5g, and 5h) are shown, which are series coupled to each other while encased in the single, internally reflective package 1. FIG. 1 also shows a circuit schematic showing the equivalent circuit of these diodes 5 as series coupled to each other between terminal 3 (diode 5a) and terminal 4 (diode 5h), so that the same forward current is conducted through all of the diodes 5 (and the diodes are thus emitting at the same time). Light produced by each emitting diode may be reflected internally in the package so that the overall illumination light emerges in this case from a top face (referred to as a light output face 2) of the package 1. Although FIG. 1 shows a four by two arrangement of the diodes 5, other arrangements are possible.

FIG. 1 also shows a top view of an illumination device 8 that has several multi-LED packages 1, including two larger multi-LED package 1b, 1c each having 24 emitting diodes in a six by four array. All of the light output faces 2 of the packages 1a, 1b, 1c, 1d are oriented in the same direction. There may be several multi-LED packages 1 that are mounted on a carrier (not shown), and that lie within the boundary of a lens or other optical element (not shown, and generically referred to here as a "lens" and a "lens boundary" 7), which may serve to refract, reflect, and/or filter the light that is produced by the multi-LED packages 1 that are positioned underneath it.

In one embodiment, the emitting diodes 5 which are series coupled to each other in a single package 1 form a high voltage LED device, having a turn on voltage that is, for example, greater than 20 volts DC, as measured across terminal 3 and terminal 4. Each of these multi-LED packages 1 may be wired to a current ratio control circuit and current source circuit that can individually set the forward current for each package 1, in order to control the intensity of light that is output by each package. The current ratio and control circuit may be installed on the carrier 2 (see FIG. 2) or elsewhere.

Figure 2:
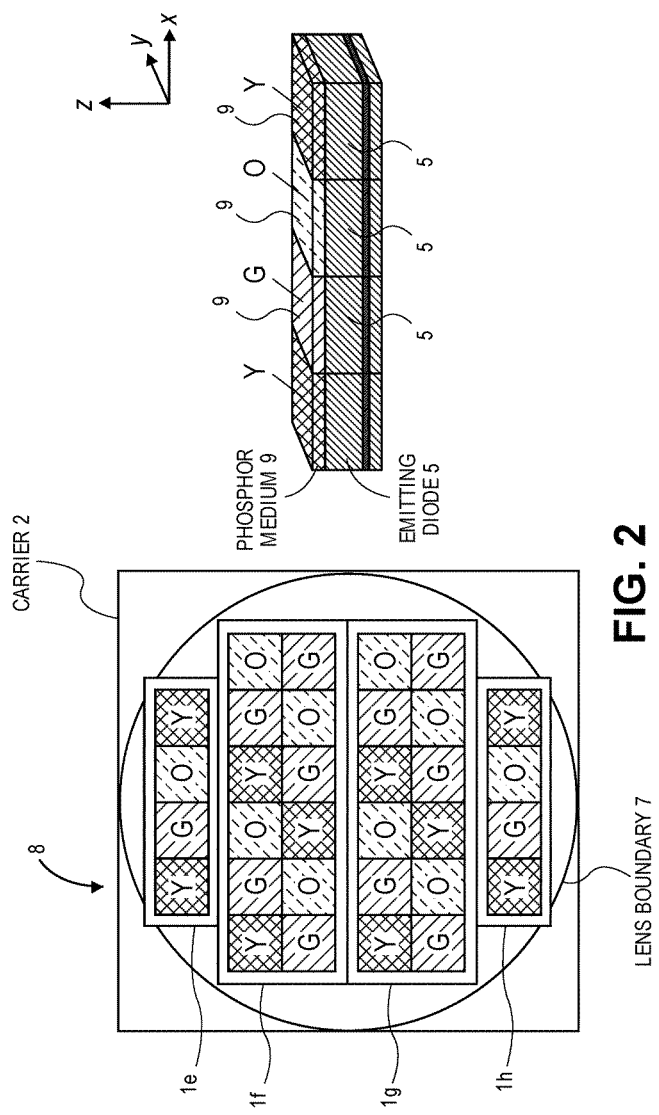
FIG. 2 shows a perspective view of a single multi-LED package having several different color phosphor mediums that overlay the individual emitting diodes of the multi-LED package, and a top view of an illumination device having several such packages mounted on a carrier, in accordance with different embodiments of the invention.

Turning now to FIG. 2, a perspective view of an embodiment of the single multi-LED package 1 is shown that has several different color phosphor mediums 9 or palettes that overlay the individual emitting diodes 5. The package 1 may be a high voltage LED package as mentioned above in which case it may have substantially more than the four emitting diodes 5 shown. The multi-LED package 1 in this case further includes a number of phosphor mediums 9 or palettes, each positioned to be stimulated by primary light of a respective one of the emitting diodes 5 (namely the one located directly beneath the palette as shown). In response, the phosphor 9 emits secondary wavelength converted light, which emerges from the light output face 2 of the multi-LED package 1 along with any remaining primary light from the emitting diode 5. In one embodiment, each of the phosphor mediums 9 has a smaller surface area (in the x-y plane shown) than its respective emitting diode 5, such that is does not overlap an adjacent emitting diode. In other embodiments however, there may be some overlap in that a given phosphor medium (of a particular color) will slightly overlap an adjacent emitting diode, perhaps due to manufacturing tolerances or variations.

In the embodiment depicted in FIG. 2, each of the multi-LED packages 1 has at least three phosphor mediums of three different colors (in this example yellow, green, and orange). Other combinations of colors for the phosphor mediums 9 are possible. The phosphor mediums 9 and their colors may be selected in order to achieve a desired hue or color in the overall illumination that is being produced by the multi-LED package 1. As explained above, each package 1 may be assigned a separately controllable current source that is coupled to the pair of terminals 3, 4 of the package, so that the forward current through the emitting diodes 5 of each package may be set individually and independently of the other packages, using for example a current ratio control circuit that sets the ration of two forward currents. This adjustability in the current ratios of the various packages, coupled with the selected colors of the phosphor mediums 9, may enable the illumination device 8 as a whole (encompassing several multi-LED packages 1 which may be oriented in the same direction as shown and are to be emitting at the same time) to produce a range of white light, for example as defined in CIE 1931 color space. Setting the forward diode current for each package 1 may for example allow the overall illumination (from two or more packages operating simultaneously) to be adjusted within a range of correlated color temperatures (CCT) of 5500K (cool white) to 2800K (warm white).

FIG. 2 also depicts another embodiment of the invention in which the overall arrangement of the phosphor mediums 8, across, in this case, four 1a, 1b, 1c, 1d multi-LED packages as a whole, has been selected so that the illumination device 8 as a whole, when it is turned off, appears to have a uniform color, such as when viewed by a person 20 centimeters away from the illumination device 8. Increasing the number of different colors used for the phosphor mediums 9, as well as increasing the number of emitting diodes 5 in each package 1, may also improve uniformity.

Figure 3:
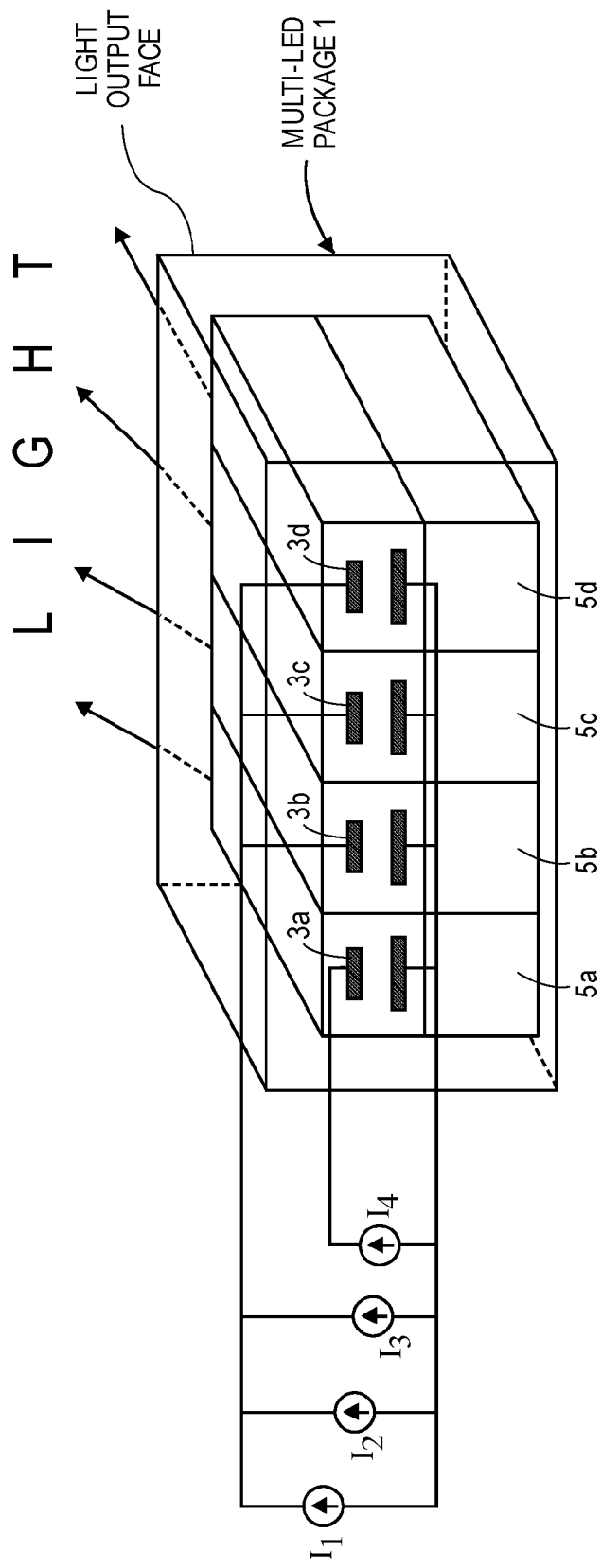
FIG. 3 is a bottom view of a multi-LED package having individually drivable emitting diodes, overlaid with a circuit schematic of an example driver circuit.

FIG. 3 depicts another embodiment of a multi-LED package 1, where in this case the emitting diodes 5 that are encased within the internally reflective package are wired so that each one is accessible from outside the package 1 individually, for purposes of controlling its forward current. A number of external terminals are provided in the package (as seen in the bottom view shown, where the light output face is opposite the bottom and is facing into the page), where each terminal 3a, 3b, 3c, 3d is coupled to for example a p-contact of a respective one of four emitting diodes 5a, 5b, 5c 5d, while the n-contacts of these four emitting diodes are electrically shorted to each other. Light, produced by all four of the emitting diodes, in response to separate currents I1, I2, I3, I4 passing through the external terminals 3a, 3b, 3c, 3d, respectively, is to emerge simultaneously from the light output face of the package. The four currents may be individually variable, by their respective current sources.

In one embodiment, each of the emitting diodes 5 within a given multi-LED package 1 is produced and cut as a separate chip or die, such that the emitting diodes are then wired together in series as in FIG. 1 or otherwise as in FIG. 3, and then packaged.

Figure 4:
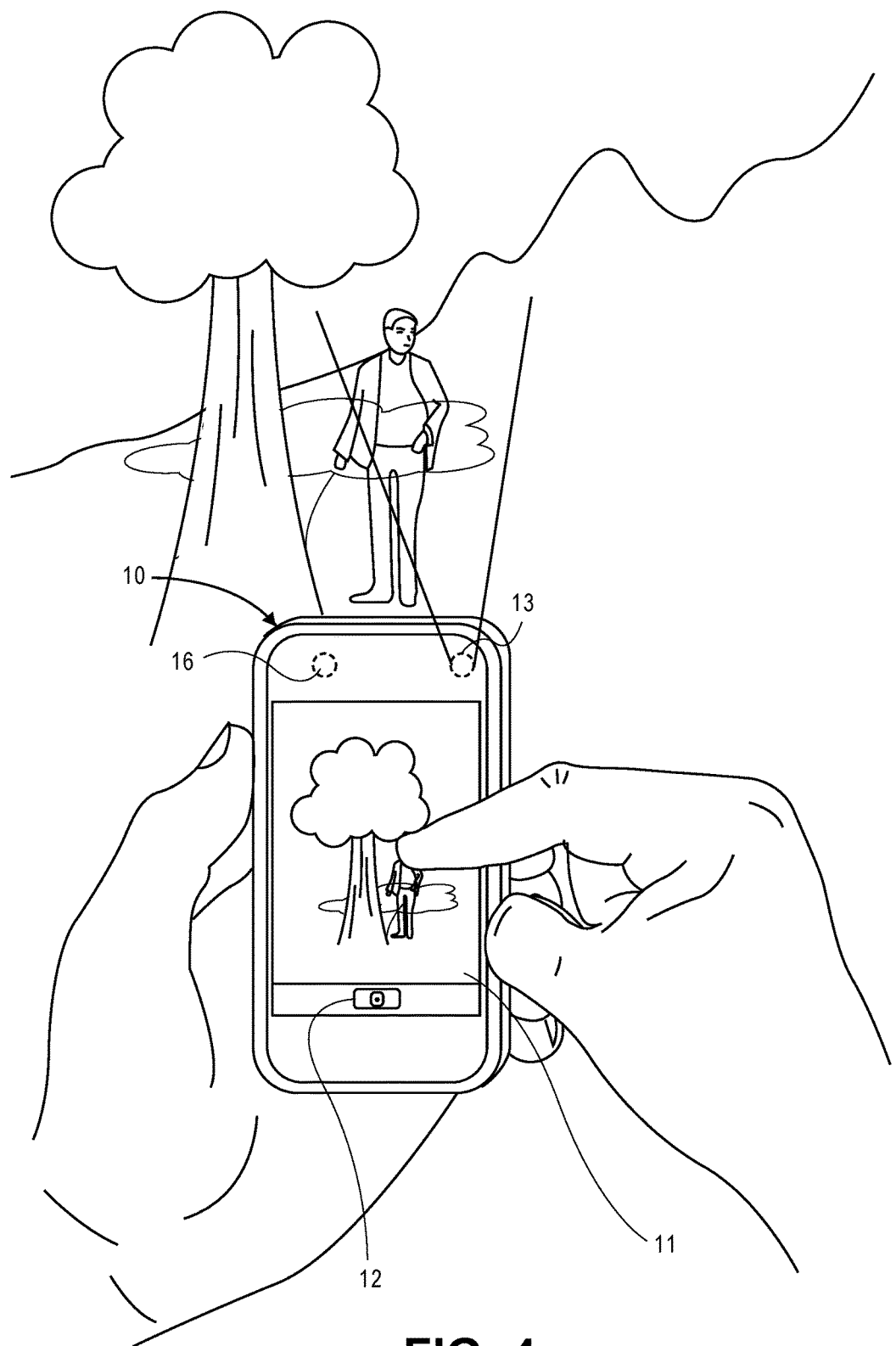
FIG. 4 shows a portable camera device in which a camera flash module is integrated.
Figure 5:
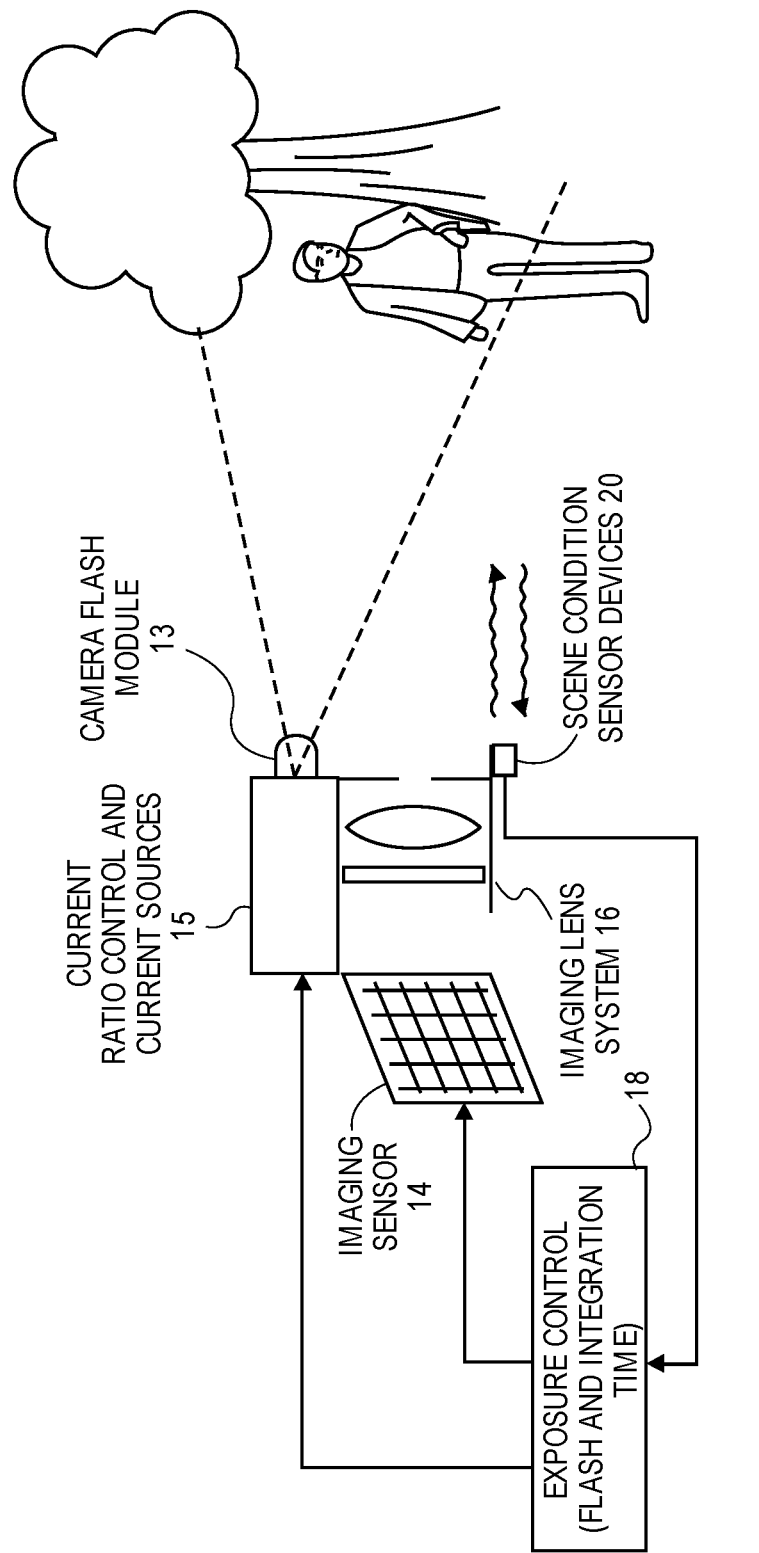
FIG. 5 is a block diagram of some of the relevant components of the portable camera device.

The combination of two or more multi-LED packages 1 as depicted in FIG. 2, where each package has color phosphor mediums dispersed over its constituent emitting diodes, may be used as a camera flash or strobe, for purposes of illuminating a scene during photography. The lens that covers the multi-LED packages 1, such as a Fresnel lens or a hemispherical lens, may be integrated along with the carrier 2, in combination with a digital camera, where the illumination device 8 may be part of a camera flash module 13 that may be integrated in a handheld portable camera device 10 such as the one depicted in FIG. 4. The camera device 10 has a body or housing (e.g., that of a smartphone, a tablet computer, a lap top computer, or other portable consumer electronic device) that has integrated therein a photography strobe module (camera flash module 13) that contains a group of two or more multi-LED packages 1 (e.g., as mounted on a carrier 2), an imaging lens system 16 which is to be aimed at the scene to form an optical image of the scene on an imaging sensor 14 (see FIG. 5), and a shutter button 12 which the user manually actuates for taking a picture using the imaging sensor 14. In the embodiment shown, an integrated touch sensitive screen 11 is used to implement a camera viewfinder function and the shutter button functionality, as in a conventional smartphone or tablet computer.

The management or high-level functions of the camera device 10 may be performed by a digital data processor (not shown) that is executing program code or instructions that are stored in the device 10, e.g. in non-volatile solid-state memory. The camera functionality of the device 10 may be obtained by the following combination of components working with each other in accordance with known techniques: imaging sensor 14, imaging lens system 16 (which may include an autofocus lens mechanism), camera flash module 13 containing several of the multi-LED packages 1, current ratio control and current source circuit 15 (for controlling the forward currents of the emitting diodes 5 in the multi-LED packages 1), optional scene condition sensor devices 20, and exposure control circuit 18. The latter may monitor the shutter button 12 for actuation by the user, and adjust exposure settings including integration time of the imaging sensor 14, and desired camera flash intensity and color (using the current ratio control circuit 15), to illuminate a scene that is being captured (optionally based on scene lighting conditions and other known photography parameters). Although not shown, enhancements such as white balance and color correction may be performed on the resulting digital images that have been captured by the sensor 14, before transferring the still pictures or video to internal camera storage in a popular digital photography file format such as JPEG, PNG or QUICKTIME. The still picture or video files may then be transferred out of the device 10 by an external I/O interface (not shown) which may be for a high speed serial bus such as one that complies with an Institute of Electrical and Electronics Engineers, IEEE, Standard 1349 or a Universal Serial Bus, USB, specification, a flash memory card, a wired local area network (LAN) such as Ethernet, a wireless LAN, or by a short range wireless link such as a Bluetooth link. The digital camera device 10 would include a programmed processor or hardwired circuitry as part of the exposure control circuit 18 to control the intensity and color of the light produced by the illumination device 8 as described above, by communicating with the current ratio control circuit 15 so that the illumination device 8 functions as a photography strobe which is adjustable to provide different colors of white illumination or different shades of white illumination upon the scene being captured.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. An illumination device comprising:
    a first multi-LED package that includes a plurality of first emitting diodes that are series coupled to each other and that are encased within a single, internally reflective package having two external terminals, wherein the package has a light output face from which light, produced by all of the first emitting diodes in response to a first current passing through the two terminals, is to emerge,
    wherein the first multi-LED package further comprises a plurality of first phosphor mediums each positioned to be stimulated by primary light of a respective one of the first emitting diodes, and in response emit secondary wavelength-converted light that emerges from the light output face of the first multi-LED package;

a second multi-LED package that includes a plurality of second emitting diodes that are series coupled to each other and that are encased within a single, internally reflective package having two terminals, wherein the package has a light output face from which light, produced by all of the second emitting diodes in response to a second current passing through them, is to emerge, wherein the second multi-LED package further comprises a plurality of second phosphor mediums each positioned to be stimulated by primary light of a respective one of the second emitting diodes, and in response emit secondary wavelength-converted light that emerges from the light output face of the second multi-LED package; and a carrier on which the first and second multi-LED packages are mounted and having conductors that are electrically coupled to the two terminals of each of the first and second multi-LED packages.

2. The device of claim 1 wherein the plurality of first emitting diodes, that are series coupled to each other, form a high voltage LED having a turn on voltage greater than 20 Volts dc across the two terminals.

3. The device of claim 1 wherein the plurality of first emitting diodes comprise at least nine emitting diodes that are series coupled.

4. The device of claim 3 wherein each of the first phosphor mediums has a smaller surface area than its respective first emitting diode such that it does not overlap an adjacent emitting diode.

5. The device of claim 3 wherein the plurality of first phosphor mediums include at least three phosphor mediums having three different colors, respectively, and wherein the plurality of second phosphor mediums include at least three phosphor mediums having said three different colors.

6. The device of claim 5 wherein individual size and overall arrangement of the first and second phosphor mediums are such that as a whole light output faces of the first and second packages which exposes all of the first and second phosphor mediums appear to be the same color when the illumination device is turned off, as viewed by a person twenty centimeters away from the illumination device.

7. The device of claim 5 wherein the three different colors are yellow, green and orange.

8. The device of claim 5 further comprising a Fresnel lens structure that covers all of the first and second phosphor mediums.

9. The device of claim 3 wherein individual size and overall arrangement of the first and second phosphor mediums are such that as a whole light output faces of the first and second packages which exposes all of the first and second phosphor mediums appear to be the same color when the illumination device is turned off, as viewed by a person twenty centimeters away from the illumination device.

10. The device of claim 9 wherein the plurality of first emitting diodes, that are series coupled to each other, form a high voltage LED having a turn on voltage greater than 20 Volts dc across the two terminals.

11. The device of claim 9 wherein each of the plurality of first emitting diodes is a separate semiconductor die or chip having a first p contact that is coupled to a p-type region and a second p contact that is coupled to an n-type region.

12. The device of claim 1 wherein the plurality of second emitting diodes, that are series coupled to each other, form a high voltage LED having a turn on voltage greater than 20 Volts dc across the two terminals of the second multi-LED package.

13. The device of claim 1 wherein each of the plurality of first emitting diodes is a separate semiconductor die or chip having a first p contact that is coupled to a p-type region and a second p contact that is coupled to an n-type region.

14. A portable electronic camera device, comprising:

a portable electronic device housing having integrated therein a digital camera and an illumination device, wherein the digital camera includes exposure control circuitry to control operation of the illumination device as a photography strobe through a current ratio control circuit, and wherein the illumination device includes a first multi-LED package that includes a plurality of first emitting diodes that are series coupled to each other and that are encased within a single, internally reflective package having two terminals, wherein the package has a light output face from which light, produced by all of the first emitting diodes in response to a first current passing through the two terminals, is to emerge, a second multi-LED package that includes a plurality of second emitting diodes that are series coupled to each other and that are encased within a single, internally reflective package having two terminals, wherein the package has a light output face from which light, produced by all of the second emitting diodes in response to a second current passing through them, is to emerge, and a carrier on which the first and second multi-LED packages are mounted and having wires that electrically couple the two terminals of each package to the current ratio control circuit, wherein a current ratio of the first and second currents is adjustable by the current ratio control circuit.

15. The camera device of claim 14 wherein the first multi-LED package further comprises a plurality of first phosphor mediums each positioned to be stimulated by primary light of a respective one of the first emitting diodes, and in response emit secondary wavelength-converted light that emerges from the light output face of the first multi-LED package, wherein the second multi-LED package further comprises a plurality of second phosphor mediums each positioned to be stimulated by primary light of a respective one of the second emitting diodes, and in response emit secondary wavelength-converted light that emerges from the light output face of the second multi-LED package, and wherein individual size and overall arrangement of the first and second phosphor mediums are such that as a whole the first and second phosphor mediums appear to be the same color from outside of the housing, when the illumination device is turned off, when viewed by a person twenty centimeters away from the illumination device.

16. The camera device of claim 15 wherein the current ratio is adjustable, so that a combined illumination from the first multi-LED package is white, while a combined illumination from the second multi-LED package is a warmer white.

17. The camera device of claim 15 wherein the illumination device further comprises a Fresnel lens structure that covers the first and second multi-LED packages.

18. The camera device of claim 15 wherein the plurality of first phosphor mediums include at least three phosphor mediums having three different colors, respectively, and wherein the plurality of second phosphor mediums include at least three phosphor mediums having said three different colors.

19. An illumination device comprising:

a first multi-LED package that includes a plurality of first emitting diodes that are encased within a single, internally reflective package having a plurality of external terminals, wherein each of the external terminals is coupled to a p-contact or an n-contact of a respective one of the plurality of first emitting diodes, and wherein the first package has a light output face from which light, produced by all of the first emitting diodes in response to separate currents passing through the external terminals, respectively, is to emerge; and a second multi-LED package that includes a plurality of second emitting diodes that are encased within a single, internally reflective package having a plurality of external terminals, wherein each of the external terminals is coupled to a p-contact or an n-contact of a respective one of the plurality of second emitting diodes, and wherein the second package has a light output face from which light, produced by all of the second emitting diodes in response to separate currents passing through the external terminals, respectively, is to emerge.

20. The illumination device of claim 19 wherein the first multi-LED package further comprises a plurality of first phosphor mediums each positioned to be stimulated by primary light of a respective one of the first emitting diodes, and in response emit secondary wavelength-converted light that emerges from the light output face of the first multi-LED package, and wherein the second multi-LED package further comprises a plurality of second phosphor mediums each positioned to be stimulated by primary light of a respective one of the second emitting diodes, and in response emit secondary wavelength-converted light that emerges from the light output face of the second multi-LED package, and wherein individual size and overall arrangement of the first and second phosphor mediums are such that as a whole the first and second phosphor mediums appear to be the same color from outside of the housing, when the illumination device is turned off, when viewed by a person twenty centimeters away from the illumination device.

\* \* \* \* \*